(12) United States Patent
Lee

(10) Patent No.: US 6,526,078 B2
(45) Date of Patent: Feb. 25, 2003

(54) LIGHT SOURCE

(75) Inventor: Jung Yuan Lee, Tu-Chen (TW)

(73) Assignee: Hon Hai Precision Ind. Co., Ltd., Taipei Hsien (TW)

(*) Notice: Subject to any disclaimer, the term of this patent is extended or adjusted under 35 U.S.C. 154(b) by 5 days.

(21) Appl. No.: 09/968,431

(22) Filed: Sep. 28, 2001

(65) Prior Publication Data
US 2003/0002547 A1 Jan. 2, 2003

(30) Foreign Application Priority Data
Jun. 29, 2001 (TW) .................................. 090210903 U

(51) Int. Cl.[7] .............................................. H01S 5/0683
(52) U.S. Cl. ................. 372/31; 372/29.011; 372/29.014
(58) Field of Search .............................. 372/36, 29.01, 372/29.011, 29.014, 29.02, 29.021, 31

(56) References Cited

U.S. PATENT DOCUMENTS 5,835,514 A * 11/1998 Yuen et al. .................. 372/36
6,061,371 A * 5/2000 Uejima et al. ............... 372/31

* cited by examiner

Primary Examiner—James W. Davie
(74) Attorney, Agent, or Firm—Wei Te Chung

(57) ABSTRACT

A light source (27) comprises a header (30), electrical conductors (31), (32), (33), a light sensor (40), a laser (39), a can (28), a convex lens (36), and an external control circuit (34). A window (35) is defined in an inclined top of the can (28), and the convex lens (36) is mounted within the window (35). A convex surface of the inclined convex lens (36) faces away from the light sensor (40). The laser (39) and the light sensor (40) are separately mounted on the header (30). The electrical conductors (31), (32), (33) electrically connect with the control circuit (34). The convex lens (36) has a pre-determined curvature such that emitted light beams of the laser (39) reflected from the lens (36) converge onto the light sensor (40). Accordingly, the reflected light beams (52) received by the light sensor (40) are accurately proportional to the emitted light power of the laser (39). Thus the control circuit (34) can precisely control the light intensity of the laser (39) to maintain the emission power of the laser (39) at a steady level.

18 Claims, 3 Drawing Sheets

LIGHT SOURCE

BACKGROUND OF THE INVENTION

1. Field of the Invention

The present invention relates generally to light sources used in optical communication systems, and particularly to laser light sources capable of generating steady light with controlled intensity.

2. Description of Related Art

Semiconductor lasers are used in many fields including optical communication systems and optical memory systems. Semiconductor lasers include edge-emitting lasers and surface-emitting lasers. Edge-emitting lasers require high threshold current, therefore surface-emitting lasers are frequently preferred. In particular, vertical-cavity surface-emitting lasers are being adopted in many new systems because they are relatively easy to manufacture and are cost-efficient. Such surface-emitting laser must be mounted in a package to prevent dirt and external temperature variations from impairing the performance of the laser, and to prevent components within the package from aging prematurely. The package provides a stable working environment for the laser, and the light intensity of the laser can be maintained at a steady level.

FIG. 1 shows a conventional method for packing a laser adopting TO-CAN structure, as disclosed in U.S. Pat. No. 5,835,514. A light source 1 comprises a header 4, electrical conductors 5, 6 and 7, a light sensor 8, a laser 9, a can 2 and a convex beam-splitting lens 11. The light sensor 8 is mounted on the header 4. The laser 9 is mounted on the light sensor 8, with a light receiving area of the light sensor 8 surrounding a periphery of the laser 9. A window 10 is mounted in a top portion of the can 2. The can 2 is mounted on the header 4, and the laser 9 and the light sensor 8 are mounted within the can 2. The convex beam-splitting lens 11, such as a ball lens, is mounted within the window 10. The electrical conductors 5, 6 and 7 electrically connect with and extend from the header 4 to connect with an external control circuit. Thus, the laser 9 and the light sensor 8 are connected with the external control circuit. Part of the light beam generated by the laser 9 is reflected by the convex beam-splitting lens 11 to the light sensor 8. The light sensor 8 generates an electrical signal in response to the reflected light beam, and transfers the signal to the external control circuit via the electrical conductors 5, 6 and 7. The light intensity of the laser 9 is thereupon adjusted to maintain the emission power of the laser 9 at a steady level.

The above-described light source has serious drawbacks. The convex beam-splitting lens 11 is a ball lens. Thus, the reflected light beam is scattered over a wide area including areas outside a periphery of the light sensor 8. Furthermore, the laser 9 is mounted on the light sensor 8, thereby blocking part of the light receiving area of the light sensor 8. These factors in combination result in only part of the reflected light beam being received by the light sensor 8. Furthermore, part of the reflected light beam 14 goes back to the laser 9 itself. This interferes with the light being emitted by the laser 9, and results in unsteady emission of the laser 9.

FIG. 2 is a graph showing the relationship between emission power $P_1$ and the drive current I of the laser 9 at different external temperatures $T_1$, $T_2$. It can be seen that the $P_1$-I characteristic curve 12 changes into the $P_1$-I characteristic curve 13 in response to a change of the external temperature from $T_1$ to $T_2$. That is, at an identical drive current, the laser 9 generates different emission powers in response to different external temperatures. In order to maintain the emission power of the laser 9 at a steady level, an external control circuit needs to be adopted to adjust the drive current to the laser 9 and thereby control the emission power of the laser 9.

Referring to FIG. 3, curves 23, 24 respectively show the relationships between reflected light power $P_2$ of the laser 9 and the light receiving area $X_1$-$X_2$, $X_3$-$X_4$ of the light sensor 8 at different external temperatures $T_1$, $T_2$. That is, the light energy distribution characteristic curve 23 of the light receiving area $X_1$-$X_2$, $X_3$-$X_4$ of the light sensor 8 changes into the characteristic curve 24 in response to the change of the external temperature from $T_1$ to $T_2$. A ratio of the light energy received by the light sensor 8 to the total reflected light energy is variable. Accordingly, the light sensor 8 inaccurately measures the output light power of the laser 9. The external control circuit cannot control the laser 9 precisely, and the emission power of the laser 9 is unstable.

FIG. 4 shows another conventional method for packing a laser, which includes an inclined top structure. A laser 19 and a light sensor 20 of a light source 111 are separately mounted on a header 17. A planar beam-splitting lens 22 is placed within a window 21 of an inclined top of a can 15. This design eliminates the problem of reflected light going back to the laser 19 itself. However, the beam-splitting lens 22 does not converge the reflected light beams. The light sensor 20 still receives only a fraction of the reflected light beams, which results in imprecise measurement of a ratio of the reflected light to the emitted light. Furthermore, the beam-splitting lens 22 is sensitive to changes in temperature. The beam-splitting lens 22 distorts with any change in temperature, resulting in a variable spread of reflected light beams reaching the light sensor 20. Thus, the external control circuit cannot precisely control the light intensity of the laser 19, and the emission power of the laser 19 is unstable.

Referring to FIG. 5, curves 25, 26 respectively show the relationships between reflected light power $P_3$ of the laser 19 and the light receiving area $X_1$-$X_2$ of the light sensor 20 at different external temperatures $T_1$, $T_2$. That is, the light energy distribution characteristic curve 25 of the light receiving area $X_1$-$X_2$ of the light sensor 20 changes into the characteristic curve 26 in response to the change of the external temperature from $T_1$ to $T_2$. A ratio of the light energy received by the light sensor 20 to the total reflected light energy is variable. Accordingly, the light sensor 20 inaccurately measures the output light power of the laser 19. The external control circuit cannot control the laser 19 precisely, and the emission power of the laser 19 is unstable.

SUMMARY OF THE INVENTION

In view of the above, it is an object of the present invention to provide a light source, the emission power of which can be maintained at a steady level.

It is another object of the present invention to provide a light source having a beam splitter which can converge light beams to obviate the effects of changes of the external temperature.

In order to achieve the objects set above, a light source in accordance with the present invention generates an output light beam having a controlled intensity. The light source comprises a header, electrical conductors, a light sensor, a laser, a can, a convex lens, and an external control circuit. A window is defined in an inclined top of the can, and a convex lens serving as a beam-splitter is mounted within the window. A convex surface of the inclined convex lens faces away from the light sensor. The laser and the light sensor are separately mounted on the header. The electrical conductors extend from the header to electrically connect with the external control circuit. Emitted light beams of the laser are divided by the convex lens into output light beams and reflected light beams. The output light beams are transmitted through the convex lens as an optical carrier wave for signals. The reflected light beams are reflected toward the light sensor as feedback light for measurement. The light sensor generates electrical signals representing the intensity of the light energy falling on it. The external control circuit adjusts the emission power of the laser according to the electrical signals it receives from the light sensor. The inclined convex lens has a pre-determined curvature such that emitted light beams of the laser reflected from the lens converge onto the light sensor. Accordingly, the reflected light beams received by the light sensor are accurately proportional to the emitted light power of the laser. Thus the external control circuit can precisely control the light intensity of the laser to maintain the emission power of the laser at a steady level.

Other objects, advantages and novel features of the invention will become more apparent from the following detailed description when taken in conjunction with the accompanying drawings, in which:

DETAILED DESCRIPTION OF PREFERRED EMBODIMENT

Reference will now be made to the drawings to describe the present invention in detail.

Figure 6:
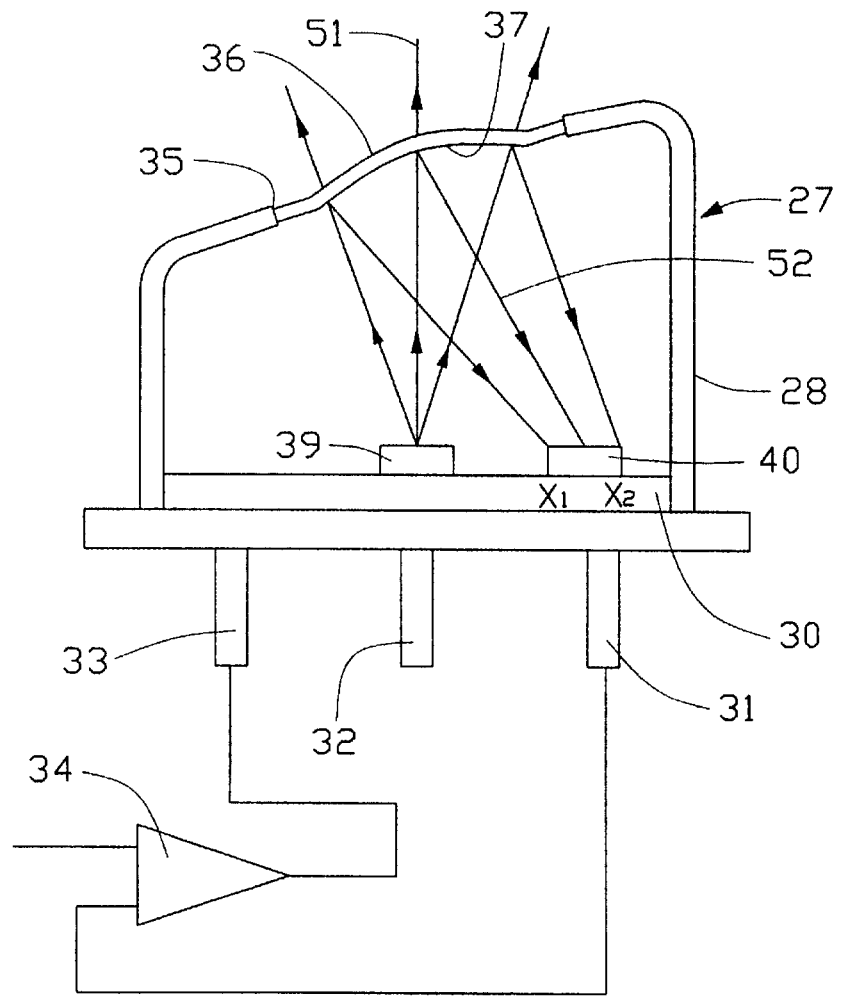
FIG. 6 is a schematic cross-sectional view of a light source in accordance with a preferred embodiment of the present invention.

Referring particularly to FIG. 6, a light source 27 in accordance with the present invention is depicted. The light source 27 comprises a header 30, electrical conductors 31, 32 and 33, a light sensor 40, a laser 39, a can 28, a convex lens 36 and an external control circuit 34. The laser 39 is mounted on a middle of the header 30, and the light sensor 40 is mounted on a periphery of the header 30. The electrical conductors 31, 32 and 33 electrically connect with a circuit of the header 30 and the control circuit 34. The can 28 is mounted on the header 30 to enclose the laser 39 and the light sensor 40 therein.

A top of the can 28 is an inclined plane, with a window 35 defined therein. A convex lens 36 is mounted within the window 35. A convex surface of the convex lens 36 faces away from the light sensor 40. The convex lens 36 comprises a concavity 37. A curvature of the concavity 37 is pre-determined so that the emitted light beams of the laser 39 reflected from the lens 36 converge onto the light sensor 40. The emitted light beams of the laser 39 are divided by the concavity 37 into output light beams 51 and reflected light beams 52. The output light beams 51 are transmitted through the convex lens 36 as an optical carrier wave for signals. The reflected light beams 52 are reflected toward the light sensor 40 as feedback light for measurement.

Figure 1:
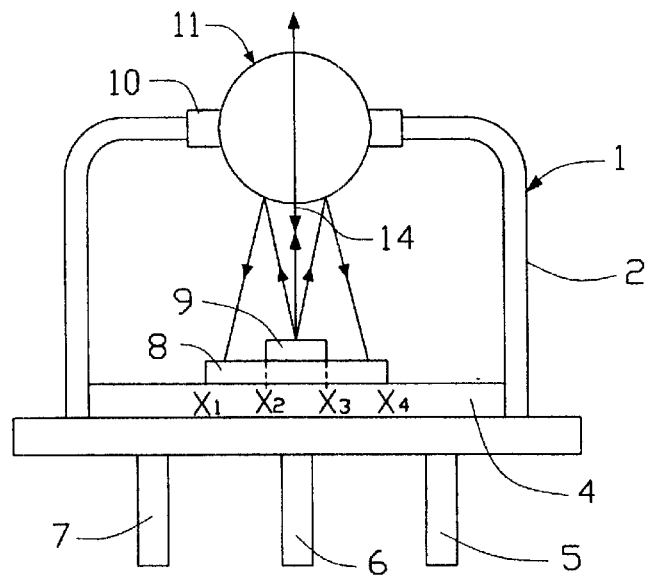
FIG. 1 is a schematic cross-sectional view of a conventional light source.
Figure 2:
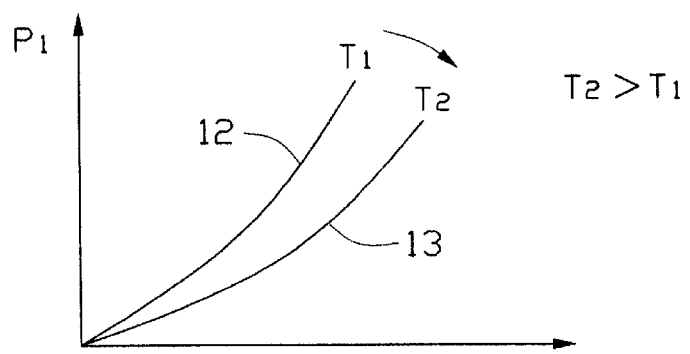
FIG. 2 is a graph showing a relationship between emission power of the laser of the light source of FIG. 1 and drive current of the light source of FIG. 1, at different external temperatures.
Figure 3:
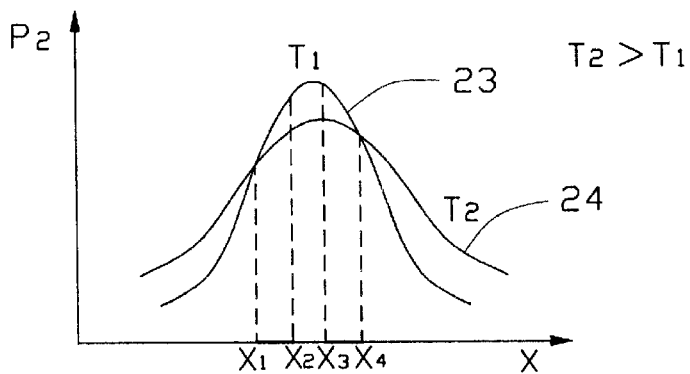
FIG. 3 is a graph showing the relationship between reflected light power of a laser of the light source of FIG. 1 and a light receiving area of a light sensor of the light source of FIG. 1, at different external temperatures.
Figure 4:
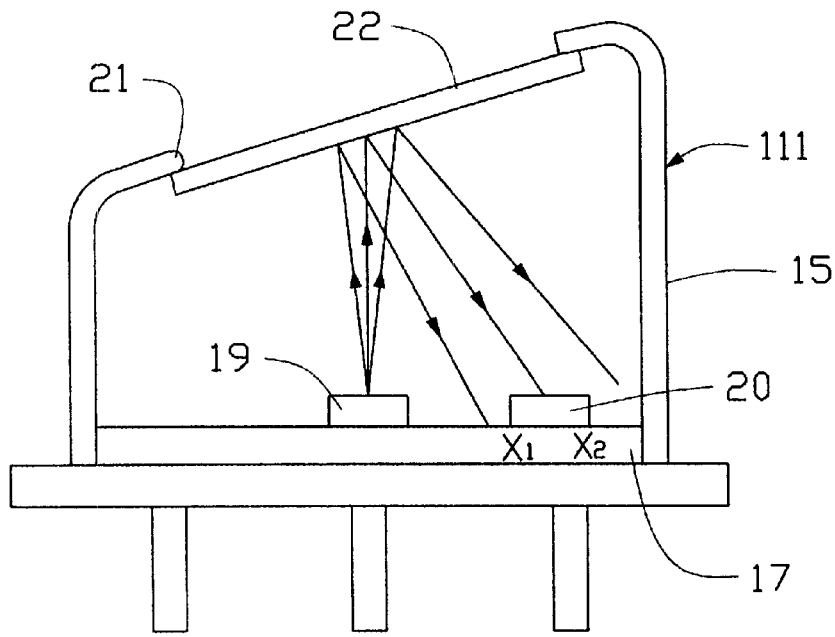
FIG. 4 is a schematic cross-sectional view of another conventional light source.
Figure 5:
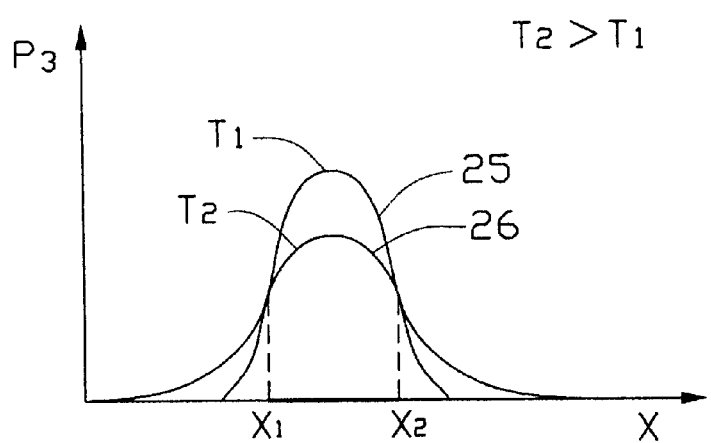
FIG. 5 is a graph showing a relationship between reflected light power of a laser of the light source of FIG. 4 and a light receiving area of a light sensor of the light source of FIG. 4, at different external temperatures.
Figure 7:
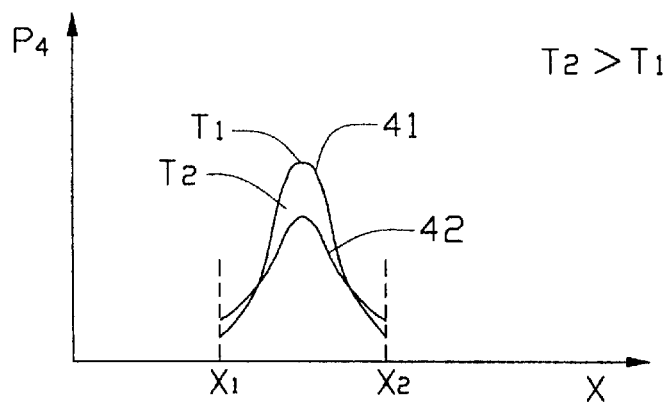
FIG. 7 is a graph showing a relationship between reflected light power of a laser of the light source of FIG. 6 and a light receiving area of a light sensor of the light source of FIG. 6, at different external temperatures.

The inclined top of the can 28 of the light source 27 cooperates with the convex lens 36 to converge the reflected light beams, such that all reflected light beams are received by the light sensor 40. No reflected light beams are fed back to the laser 39, thereby avoiding adverse effects on the stability of the laser 39. Referring to FIG. 7, curves 41, 42 show the relationships between the reflected light power $P_4$ of the laser 39 and the light receiving area $X_1$-$X_2$ of the light sensor 40 at different external temperatures $T_1$, $T_2$ respectively. A light energy distribution characteristic curve 41 of the light receiving area $X_1$-$X_2$ of the light sensor 40 changes into a characteristic curve 42 in response to a change of the external temperature from $T_1$ to $T_2$. When comparing FIG. 7 with FIGS. 3 and 5, it can be seen that the convex lens 36 of the present invention is less susceptible to variation in the external temperature in reflecting the emitted light beams from the laser 39. Furthermore, the convex lens 36 converges the reflected light beams. Accordingly, the reflected light beams received by the light sensor 40 are accurately proportional to the emitted light power of the laser 39. Thus, the external control circuit can precisely control the light intensity of the laser 39 to maintain the emission power of the laser 39 at a steady level.

While the preferred embodiment in accordance with the present invention has been shown and described, equivalent modifications and changes known to persons skilled in the art according to the spirit of the present invention are considered within the scope of the present invention as defined in the appended claims.

What is claimed is:

1. A light source, comprising:
   a header having a circuit;
   at least two electrical conductors electrically connecting with the circuit;
   a light emission component mounted on the header and electrically connecting with the circuit;
   a light sensor mounted on the header proximate to the emission component and electrically connecting to the circuit on the header for transforming light reflected onto it into corresponding electrical signals;
   a can with an inclined top, the can mounted on the header for enclosing the emission component and the light sensor, said inclined top defining a window; and
   a convex lens mounted in the window of the inclined top of the can, wherein light beams emitted by the emission component are reflected by the convex lens to converge onto the light sensor.

2. The light source as described in claim 1, wherein the emission component is a surface-emitting laser.

3. The light source as described in claim 1, wherein the electrical signals are transmitted into an external control circuit via the electrical conductors.

4. The light source as described in claim 1, wherein a convex surface of the convex lens faces away from the light sensor.

5. A light source, comprising:

a header;

a laser mounted on the header;

a sensor mounted on the header beside the laser;

conductors extending from the header and electrically connecting with the laser and the sensor;

a can mounted on the header and enclosing the laser and the sensor, the can having an inclined top, a convex lens being mounted in the inclined top, said lens reflecting part of light beams emitted from the laser onto the sensor; and a control circuit electrically connecting with the conductors.

6. The light source as describe in claim 5, wherein the light beams emitted from the laser and reflected by the lens are converged onto the sensor.

7. The light source as described in claim 6, wherein a convex surface of the lens faces away from the sensor.

8. The light source as described in claim 7, wherein the inclined top of the can defines a window, and the lens is mounted in the window.

9. A method of controlling intensity of the laser light source, comprising the steps of:

providing a laser source emitting diverging light; and providing a lens intervening in a path of said diverging light, resulting in a portion of said diverging light penetrating said lens and the other portion of said diverging light reflected therefrom; wherein said reflected light is converged to a sensor positioned on the same side of said lens with said laser source.

10. The method as described in claim 9, wherein said sensor is electrically connected to a controlling circuit.

11. The method as described in claim 9, wherein said penetrating light is divergently away from said lens.

12. The method as described in claim 9, wherein the lens is obliquely positioned relative to the laser source.

13. The method as described in claim 12, wherein a center of said lens is located at a vertical central line of said laser source.

14. The method as described in claim 9, wherein said sensor and said laser source are respectively at two opposite sides of a centerline of said lens.

15. A light source comprising:

a laser source emitting diverging light;

a lens positioned in the way of said light to reflect a portion of the light; and a sensor positioned beside said laser source; wherein said lens is configured to have said portion of the light, which is reflected by said lens, converged toward and received by said sensor essentially without intervening with said laser source.

16. The light source as described in claim 15, wherein said lens is equipped with curvature and obliquely positioned relative to said laser source.

17. The light source as described in claim 15, wherein said laser and said sensor are located by two sides of a centerline of said lens.

18. The light source as described in claim 17, wherein said centerline of said lens is angular with regard to a vertical center line of said laser along which the light is mainly emitted.

* * * * *